United States Patent [19]

Edmonds et al.

[11] 4,261,781
[45] Apr. 14, 1981

[54] PROCESS FOR FORMING COMPOUND SEMICONDUCTOR BODIES

[75] Inventors: Harold D. Edmonds, Hopewell Junction; Vincent J. Lyons; Gary Markovits, both of Poughkeepsie, all of N.Y.

[73] Assignee: International Business Machines Corporation, Armonk, N.Y.

[21] Appl. No.: 7,857

[22] Filed: Jan. 31, 1979

[51] Int. Cl.³ .............................................. H01L 5/00
[52] U.S. Cl. ................................... 156/254; 29/583; 428/64; 428/428
[58] Field of Search .................. 156/254; 428/64, 428; 29/583

[56] References Cited

U.S. PATENT DOCUMENTS

| | | | |
|---|---|---|---|
| 3,422,527 | 1/1969 | Gault | 29/572 |
| 3,488,835 | 1/1970 | Becke | 29/577 |
| 3,579,816 | 5/1971 | Ingraham | 29/583 |
| 3,623,219 | 11/1971 | Stoller | 29/580 |
| 3,864,819 | 2/1975 | Ying | 29/583 |

FOREIGN PATENT DOCUMENTS 782162  4/1968  Canada ................................. 352/32

Primary Examiner—Marion McCamish
Attorney, Agent, or Firm—James R. McBride

[57] ABSTRACT

Compound semiconductor bodies are formed by bonding a layer of supporting material to the two opposite faces of a semiconductor wafer and then cutting the semiconductor wafer into two parts in a plane parallel to said faces. The cut surface of each part is then polished.

7 Claims, 4 Drawing Figures

PROCESS FOR FORMING COMPOUND SEMICONDUCTOR BODIES

BACKGROUND OF THE INVENTION

Semiconductor wafers for integrated circuits are conventionally prepared by slicing the wafers from a single crystal of semiconductor material. The raw sliced wafers are then processed to provide a polished, damage free surface in which integrated circuit devices are formed. The integrated circuit devices are formed very close to the surface so that a surface layer of only about 5–10 microns in depth of the normally about 15 mil thick wafer is actually used to form the devices. The bulk of the thickness is used to provide sufficient strength so that the wafer won't warp or break during manufacture of the devices.

The net result is that the bulk of the high purity semiconductor material, which has been carefully grown into a single crystal, is used for a purpose which could be served by other less costly materials. With the trend to use larger diameter wafers, which must be thicker to avoid warping or breakage, even more material is wasted.

U.S. Pat. No. 3,864,819 describes a process for forming semiconductor devices where a wafer is thinned before or after bonding to a metal support plate. Processes for bonding sheets of semiconductor materials together, which are then sliced vertically to form transistors, are described, for example, in U.S. Pat. Nos. 3,422,527; 3,488,835 and 3,579,816.

The invention provides a process to form composite wafers, comprised of a thin layer of a high quality semiconductor crystal joined to a support layer, which can be processed in conventional integrated circuit manufacturing equipment. The process uses only about one half the high grade semiconductor material normally used in forming conventional wafers.

BRIEF SUMMARY OF THE INVENTION

In accordance with this invention there is provided a process for forming compound semiconductor bodies comprising joining a layer of support material to the two opposite faces of a semiconductor wafer and then cutting the semiconductor wafer into two parts in a plane substantially parallel to said faces. The cut surfaces of each part are then polished to provide two compound wafers which are suitable for use in forming integrated circuit devices.

DETAILED DESCRIPTION

The compound semiconductor bodies or wafers of the invention include a layer of monocrystalline semiconductor material bonded to a support layer. Semiconductor materials are well known in the art and include, for example, silicon, germanium, and gallium arsenide. Suitable support layers have expansion coefficients similar to the semiconductor layer and melting points high enough to withstand temperatures normally employed in integrated circuit manufacture. Materials such as polycrystalline semiconductors, glass, ceramic or glass-ceramics can be used. It is preferred to use materials with good thermal conductivity.

The initial thickness of the monocrystalline semiconductor layer should be sufficient to provide at least about 3 to 4 mils of thickness of monocrystalline material in the finished compound wafer. A starting thickness of at least about 25 mils is needed to provide two compound wafers with a 3–4 mil thick monocrystalline layer using current cutting and polishing technology. The major loss in thickness occurs during cutting. Greater thickness can be employed but are usually not needed and only result in less savings of material. The thickness of the support layer is chosen to give the required physical properties to the compound wafer and preferably to give a total thickness similar to that used with conventional wafers so that the compound wafer can be processed in existing equipment without modification, for example, about 15–20 mils for a 3 inch diameter wafer.

Polycrystalline silicon suitable for the support layers is commercially available. Glass, ceramic and polycrystalline support layers can also be prepared in the form of "green" sheets. The "green" sheets formed by coating mixtures of a powdered substrate material and a binder resin in a solvent on a support so that the solvent evaporates. The "green" sheets are laminated together and fired to drive off the binder resin and produce a hard substrate.

The bonding is done by placing the support layers in contact with the body of monocrystalline material and heating the assembly to a temperature of about 950° C. or above but less than the melting point of the semiconductor (for example 1100° C.) for about 30 minutes to 3 hours in an oxygen ambient. Intimate contact between the surfaces is needed to achieve a good bond but pressure is not needed. The structure can also be formed by molding or casting a slurry of powder with a fugitive binder onto each side of the monocrystalline body and heating. Powdered support layer material can also be used between the wafer and support layers as a bonding aid.

Figure 1A:
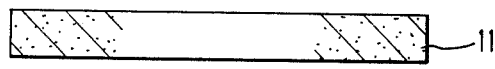
FIGS. 1A–1C are elevational views illustrating an embodiment of the process of the invention.
Figure 1B:
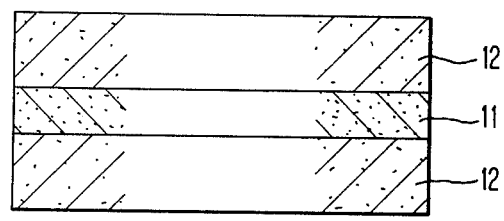
Figure 2:
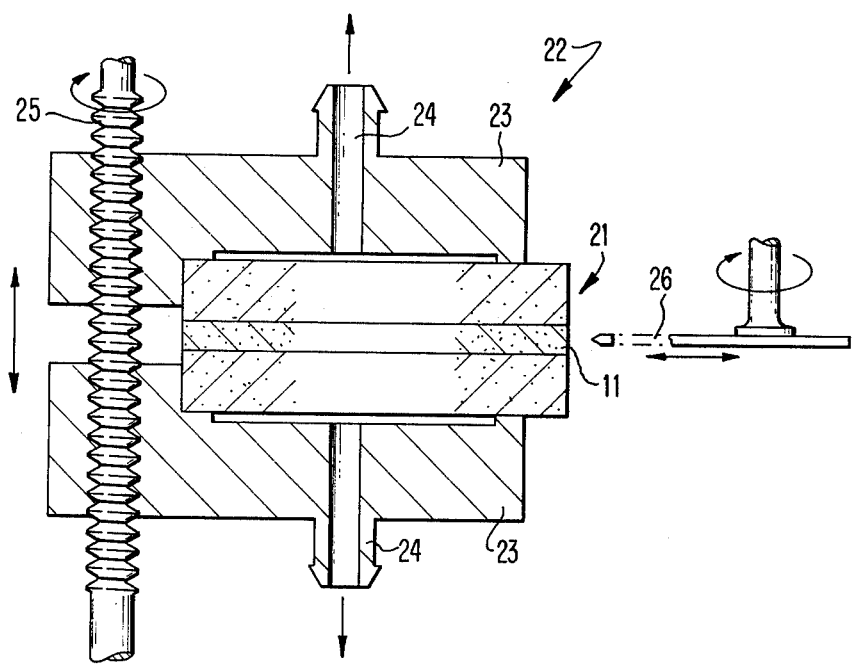
FIG. 2 is a schematic elevational view, partly in section, illustrating a means for cutting compound wafers.

The structure before cutting is illustrated in FIG. 1B where a silicon wafer 11 is bonded on each face to polycrystalline wafers 12. The wafer 11 is cut into two parts along a plane parallel to the major faces. A conventional saw which is used to slice crystals into wafers can be used, for example, an inner diameter disk cutter such as is marketed by Hamco. The saw kerf is about 14 mils. A suitable means for cutting is schematically shown in FIG. 2 where the bonded wafer assembly 21 is held in a jig 22 between plates 23. Screw 25 is provided to move wafer assembly 21 vertically into position relative to rotating saw blade 26. Jig 22 is mounted to move horizontally to cause saw blade 25 to contact and cut wafer 11. Plates 23 have ducts 24 connected to a vacuum source to hold the wafer assembly 21 and retain the two compound wafer portions in place after cutting.

After cutting, the free (cut) faces of the two monocrystalline wafer portions are processed by conventional shaping and polishing techniques such as chemical thinning and silica or copper polishing to produce two compound wafers suitable for use in integrated circuit manufacture.

Figure 1C:
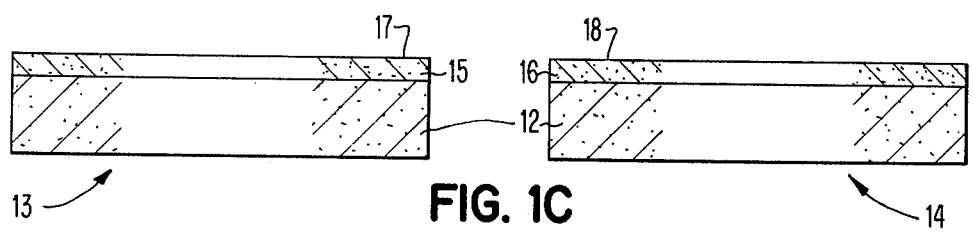

The invention is further illustrated by the following example and FIGS. 1A–1C. Monocrystalline silicon wafer 11 (FIG. 1A) of about 3¼ inches in diameter and having a thickness of 28±1 mils as cut from a crystal is ground to produce a 25±1 mils thick wafer with parallel faces. Two polysilicon disks 12 (FIG. 1B) of about the same diameter and 20 mils in thickness are placed in contact with the sides of wafer 11 and are joined to wafer 11 by heating the assembly in an oxygen ambient at 950° C. for about 30 minutes. The resulting bonded structure is sliced in half through the center of wafer 11 with a saw with a loss of 14 mils saw kerf to give two compound wafers 13 and 14 (FIG. 1C) each with a thickness of 27±1 mils. The monocrystalline layers 15 and 16 have a thickness of 7±1 mils. Each compound wafer is then ground, backside first, to 25±0.3 mils in thickness and then the frontside to a finished thickness of 24±0.03 mils leaving a monocrystalline layer thickness of about 6 mils. The compound wafers are then chemically thinned with an HF/HNO$_3$/Acetic Acid solution to remove the grinding damage from the exposed surfaces 17 and 18 of the monocrystalline layers 15 and 16. Because of a higher etch rate, about twice as much material is removed from the polysilicon disks 12 so that the total compound wafer thickness is about 18±0.5 mils with layers 15 and 16 having a thickness of about 4 mils. The surfaces 17 and 18 are then polished by contact with a rotating polishing pad using a colloidal silica polishing slurry. The surfaces are then cleaned to produce two finished compound wafers each having about a 3.5 mil thick monocrystalline layer and about a 13 mil thick polycrystalline bonding layer. If desired, the edges of the wafers can be chamfered prior to chemical thinning.

The above example provides two compound wafers with a total thickness of about 16.5 mils. The total thickness of single crystal material, including the original loss during the slicing of wafer 11 from the crystal, needed to produce two compound wafers is about 42 mils. This contrasts with about 75 mils of single crystal material which is consumed in producing two conventional wafers of a thickness of about 16.5 mils. The process of the invention therefore provides in this case a savings of about half the thickness previously required. Because wafers of a diameter larger than 3 inches require increased thickness to avoid warpage and breakage, with the trend to larger wafer diameters even greater savings can be achieved by the process of the invention. By leaving the grinding damage in the faces of the wafer which are joined to the support layers, impurity gettering sites are provided. The polycrystalline layers will also provide a gettering function. Alternatively, the wafer could be chemically thinned to remove the damage prior to joining to the support material.

The backing layers can be formed from a slurry of binder and silicon or ceramic powder which is cast in the form of "green" sheets which are fired to burn off the binder and joined to the monocrystalline wafer. The layer can be formed directly on the wafer by molding the slurry onto each side of the wafer and firing to drive off the binder. A suitable slurry is prepared as follows:

Binder 695 grams methyl isobutyl ketone
230 grams methanol
38 grams Benzaflex* dipropylene glycol dibenzoid powder
34 grams Butvar B-98** polyvinyl butyral powder (plasticizer)

*Velsicol Corp.
**Monsanto

The binder is mixed with silicon powder in proportions of 200 grams of binder to 200 grams of silicon, in a medium size ball mill for six hours using Al$_2$O$_3$ balls and a speed of 65 rpm. After six hours the mill is opened and an additional 20 grams of B-98 powder plasticizer is added and the mixture is milled for 4 more hours. The slurry is placed in a bell jar and a vacuum is applied to remove trapped air from the slurry.

The slurry is cast by a doctor blade onto a plastic sheet such as Mylar plastic and the solvent evaporates. A number of cast "green" sheets are stacked, laminated and fired at gradually increasing temperatures to burn off the binder and sinter and densify the stacked sheets into a silicon body as is known in the ceramic art.

We claim:

1. A process for forming compound semiconductor bodies comprising joining a layer of support material to each of the two opposite major faces of a semiconductor wafer and cutting the wafer into two portions in a plane between and substantially parallel to said opposite major faces.

2. The process of claim 1 wherein the plane is substantially equally spaced between said opposite major faces.

3. The process of claim 1 including the step of polishing the cut surfaces of said portions.

4. The process of claim 3 wherein the semiconductor wafer is monocrystalline silicon.

5. The process of claim 4 wherein the layers of support material are disks of polycrystalline silicon which are joined to said wafer by placing the disks in contact with the opposite faces of the wafer and heating to a temperature of from about 950° C. to below the melting point of the semiconductor in an oxygen ambient.

6. The process of claim 4 wherein the layers of support material are joined to said wafer by preparing a slurry of powdered support material and resin binder in a solvent, applying the slurry to the opposite faces of said wafer, evaporating the solvent, and firing so as to burn off the binder and sinter and compact the support material into a unitary structure with said wafer.

7. The process of claim 3 wherein the wafer has a thickness of at least about 25 mils and the cut and polished portions have a thickness of about 3 to 4 mils.

* * * * *